(12) United States Patent
Tweet

(10) Patent No.: US 7,935,617 B2
(45) Date of Patent: May 3, 2011

(54) METHOD TO STABILIZE CARBON IN $SI_{1-x-y}GE_xC_y$ LAYERS

(75) Inventor: Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 1331 days.

(21) Appl. No.: 10/931,327

(22) Filed: Aug. 31, 2004

(65) Prior Publication Data

US 2006/0046507 A1    Mar. 2, 2006

(51) Int. Cl.
*H01L 21/20*    (2006.01)
*C30B 25/00*    (2006.01)
*C30B 29/10*    (2006.01)

(52) U.S. Cl. ........ 438/507; 438/509; 438/486; 117/104; 117/8; 257/E21.102; 257/E21.103

(58) Field of Classification Search .................. 438/758, 438/778, 786, 931, 933, 486, 507, 509; 117/8, 117/104; 257/E21.102, E21.103
See application file for complete search history.

(56) References Cited

U.S. PATENT DOCUMENTS

| | | | |
|---|---|---|---|
| 5,986,287 A | 11/1999 | Eberl et al. | |
| 6,403,975 B1 * | 6/2002 | Brunner et al. | 257/15 |
| 6,649,496 B2 * | 11/2003 | Kanzawa et al. | 438/488 |
| 6,667,489 B2 * | 12/2003 | Suzumura et al. | 257/12 |
| 6,852,602 B2 * | 2/2005 | Kanzawa et al. | 438/312 |
| 6,936,869 B2 * | 8/2005 | Webb et al. | 257/192 |

OTHER PUBLICATIONS

Foo et al., $Si_{1-y}C_y/Si$ *(001) gas-source molecular beam epitaxy from $Si_2H_6$ and $CH_3SiH_3$: Surface reaction paths and growth kinetics*, J. Appl. Phys. 93, 3944 (2003).
Lee et al., *Strained-Si N- and PMOSFETs on Thin Graded SiGe Virtual Substrates*, Proceedings of the Third International Conference on SiGe(C) Epitaxy and Heterostructures (ICSI3), p. 135 (2003).
Mantl et al., *Thin strain relaxed SiGe buffer layers on Si and SOI made by He+ ion implantation and annealing*, Proceedings of the Third International Conference on SiGe(C) Epitaxy and Heterostructures (ICSI3), p. 120 (2003).
Rim et al., *Strained Si NMOSFETs for High Performance CMOS Technology*, 2001 Symposium on VLSI Technology Digest of Technical Papers, p. 59, IEEE 2001. [10] Quinones et al., *Design, Fabrication, and Analysis of SiGeC Heterojunction PMOSFETs*, IEEE Trans. El. Dev. 47, 1715 (2000).
Mocuta et al., $Si_{1-x-y}Ge_xC_y$-*Channel P-MOSFET's with Improved Thermal Stability*, IEEE Elec. Dev. Lett., 21, 292 (2000).
Remediakis et al., *Thermodynamics of C Incorporation on Si(100) from ab initio Calculations*, Phys Rev. Lett. 86, 4556 (2001).

(Continued)

*Primary Examiner* — Mary Wilczewski
(74) *Attorney, Agent, or Firm* — David C. Ripma

(57) ABSTRACT

A method of providing a layer in a semiconductor device, wherein the layer includes $Si_{1-x-y}Ge_xC_y$, and wherein the carbon in the layer is in a stable condition, includes preparing a silicon substrate; preparing a SiGeC precursor; forming a $Si_{1-x-y}Ge_xC_y$ layer on the silicon substrate from the precursor; forming a top silicon layer on the $Si_{1-x-y}Ge_xC_y$ layer; and completing the semiconductor device.

14 Claims, 1 Drawing Sheet

OTHER PUBLICATIONS

Liu et al., *Ab initio investigation of C incorporation mechanisms on Si(001)*, Appl. Phys. Lett. 76, 885 (2000).

De Salvador et al., *Lattice parameter of $Si_{1-x-y}Ge_xC_y$ alloys*, Rev. B, 61, 13005 (2000).[3] Mantl et al., *Strain relaxation of Epitaxial SiGe layers on Si (100) improved by hydrogen implantation*, Nuclear Instruments and Methods in Physics Research B 147, 29, (1999).

Quinones et al., *Enhanced Mobility PMOSFET's Using Tensile-Strained $Si_{1-y}C_y$ Layers*, IEEE El. Dev. Lett., '20, 338 (1999).

Mocuta et al., *Carbon incorporation in SiGeC alloys grown by ultrahigh vacuum chemical vapor deposition*, J. Vac. Sci. Technol. A 17, 1239 (1999). [9] Rim et al., *Characteristics of Surface-Channel Strained $Si_{1-y}C_y$ n-MOSFETs*, Mat. Res. Soc. Symp. Proc. vol. 533, 43 (1998).

Chandrasekhar et al., *Strategies for the synthesis of highly concentrated $Si_{1-y}C_y$ diamond-structured systems*, Appl. Phys. Lett. 72, 2117 (1998).

Rim et al., *Metal-oxide-semiconductors capacitance-voltage characteristics and band offsets for $Si_{1-y}C_y/Si$ heterostructures*, Appl. Phys. Lett., 72, 2286 (1998).

Sturm, *Advanced Column-IV Epitaxial Materials for Silicon-Based Optoelectronics*, MRS Bulletin, Apr. 1998, pp. 60-64.

Carroll et al., *Complete suppression of boron transient-enhanced diffusion and oxidation-enhanced diffusion in silicon using localized substitutional carbon incorporation*, Appl. Phys. Lett., 73, 3695 (1998).

Houghton et al., *Band Alignment in $Si_{1-y}C_y/Si$ (001) and $Si_{1-x}Ge_x/Si_{1-y}/Si$ (001) Quantum Wells by Photoluminescence under Applied [100] and [110] Uniaxial Stress*, Phys. Rev. Lett., 78, 2441 (1997).

Mitchell et al., *Substitutional carbon incorporation in epitaxial $Si_{1-y}C_y$ layers grown by chemical vapor deposition*, Appl. Phys. Lett., 71, 1688 (1997).

Nayak et al., *High-Mobility Strained-Si PMOSFET's* IEEE Transactions on Electron Devices, vol. 43, 1709 (1996).

Tweet et al., *Increased thermal stability due to addition of Ge in B/Si(111) heterstructures*; Physica B 221, 218 (1996).

Mi et al., *High quality $Si_{1-x-y}Ge_xC_y$ epitaxial layers grown on (100) Si by rapid thermal chemical vapor deposition using methylsilane*, Appl. Phys. Lett., 67, 259 (1995).

Tweet et al., *Direct Observations of Ge and Si Ordering at the Si/B/$Ge_xSi_{1-x}$(111) Interface by Anomalous X-Ray Diffraction*, Phys. Rev. Lett. 69, 2236 (1992).

* cited by examiner

METHOD TO STABILIZE CARBON IN $\text{SI}_{1-x-y}\text{GE}_x\text{C}_y$ LAYERS

FIELD OF THE INVENTION

This invention relates to high speed CMOS integrated circuits, heterostructure bipolar transistors, and silicon-based optoelectronics, and specifically to use of $\text{Si}_{1-x-y}\text{Ge}_x\text{C}_y$ layers in such devices.

BACKGROUND OF THE INVENTION

In enhanced mobility MOSFET device applications thick, relaxed $\text{Si}_{1-x}\text{Ge}_x$ buffer layers on bulk silicon wafers have been used as virtual substrates for thin strained silicon layers to increase carrier mobility for both NMOS, Rim et al., *Strained Si NMOSFETs for High Performance CMOS Technology,* 2001 Symposium on VLSI Technology Digest of Technical Papers, p. 59, IEEE 2001; and PMOS, Nayak et al., *High-Mobility Strained-Si PMOSFET's* IEEE Transactions on Electron Devices, Vol. 43, 1709 (1996), devices. The current state-of-the-art for producing a high-quality, relaxed $\text{Si}_{1-x}\text{Ge}_x$ buffer layer requires the growth of a several μm thick compositionally graded layer, Rim et al.; Nayak et al., supra. However, the density of threading dislocations in these SiGe layers is still high, typically >$10^6/\text{cm}^2$, and the layer growth process is expensive and time consuming. Alternate methods to efficiently relax thinner, e.g., 100 nm to 500 nm, strained SiGe layers on silicon have been implemented, although not all of these methods have been commercialized. In particular, hydrogen, in the form of $\text{H}^+$ or $\text{H}_2^+$ implantation, or $\text{He}^+$ implantation, followed by an appropriate anneal, has been used to increase the degree of SiGe relaxation and to reduce the density of threading dislocations; Mantl et al., *Strain relaxation of Epitaxial SiGe layers on Si (100) improved by hydrogen implantation,* Nuclear Instruments and Methods in Physics Research B 147, 29, (1999); Mantl et al., *Thin strain relaxed SiGe buffer layers on Si and SOI made by He+ ion implantation and annealing,* Proceedings of the Third International Conference on SiGe(C) Epitaxy and Heterostructures (ICSI3), p. 120 (2003); and Lee et al., *Strained-Si N— and PMOSFETs on Thin Graded SiGe Virtual Substrates,* Proceedings of the Third International Conference on SiGe (C) Epitaxy and Heterostructures (ICSI3), p. 135 (2003).

The goal of all of these techniques is to produce a "virtual substrate" having a lattice constant parallel to the virtual substrate surface which is larger than that of bulk silicon. On this surface, a thin layer of epitaxial silicon may be grown, which is under tensile strain parallel to the surface. Because of the changes in band structure from the tensile strain, both electron and hole mobilities are significantly enhanced. Germanium is used in the virtual substrate because it has a larger lattice constant than silicon and is fully miscible, i.e., 100% bulk solid solubility, with silicon at all concentrations, meaning that it tends to stay in the substitutional sites in the silicon lattice. However, the production of these virtual substrates is expensive and invariably results in a high density of threading dislocations and other defects.

Instead of adding a larger atom, such as germanium, to the silicon substrate, an alternative method to producing tensile strain in a surface layer of silicon has been to add a smaller atom, such as carbon, to the surface, Eberl et al., U.S. Pat. No. 5,986,287, granted Nov. 16, 1999 for Semiconductor structure for a transistor. This requires growing a very thin layer of $\text{Si}_{1-y}\text{C}_y$ on top of a conventional silicon substrate. Only about 1% carbon, e.g., y=0.01, is needed to achieve significant tensile strain. This method, once commercialized, may be significantly cheaper than the virtual substrate method using relaxed SiGe, and will produce similar gains in electron and hole mobilities. However, a problem arises because carbon is not very miscible in silicon. The bulk solid solubility is only ~$10^{-5}$, because of the large mismatch in bond length and energy between silicon and carbon. At higher concentrations, the carbon leaves silicon substitutional sites and forms various clusters. However, because of surface mechanisms, Mitchell et al., *Substitutional carbon incorporation in epitaxial $\text{Si}_{1-y}\text{C}_y$ layers grown by chemical vapor deposition,* Appl. Phys. Lett., 71, 1688 (1997), it has been found that tensile $\text{Si}_{1-y}\text{C}_y$ films, with the carbon mostly in substitutional sites, may be fabricated provided low deposition temperatures are used, e.g., between 400° C. and 650°. Higher temperature processing of these films, to form transistors, such as nMOSFETs or pMOSFETs, results in carbon clustering, and the resulting electron and hole mobilities are generally poor.

Clearly, a means to stabilize the carbon in the silicon lattice at higher processing temperatures, e.g., 1000° C., will be extremely valuable. Specifically, tensile strained $\text{Si}_{1-y}\text{C}_y$ layers have been used to produce pMOSFETs with enhanced performance by low temperature processing, e.g., ~750° C. or lower, Quinones et al., *Enhanced Mobility PMOSFET's Using Tensile-Strained $\text{Si}_{1-y}\text{C}_y$ Layers,* IEEE El. Dev. Lett., 20, 338 (1999). $\text{I}_D$ enhancements of 12-28% for 15 nm thick layers, where y=0.005, have been reported. Samples where y=0.01 exhibited poor performance. Surface channel tensile strained $\text{Si}_{1-y}\text{C}_y$ layers have been used for nMOSFETs, but without improved mobilities at room temperature, Rim et al., *Characteristics of Surface-Channel Strained $\text{Si}_{1-y}\text{C}_y$ n-MOSFETs,* Mat. Res. Soc. Symp. Proc. vol. 533, 43 (1998), even though process temperatures were limited to 600° C. Carbon in interstitial sites and in clusters may have contributed to this lack of improvement.

In addition to surface channel tensile $\text{Si}_{1-y}\text{C}_y$ layers, carbon doping may be used in other device structures as well. Adding carbon to compressive SiGe layers, thereby forming a compressive SiGeC layer, has been shown to improve buried p-channel MOSFETs: Quinones et al., *Design, Fabrication, and Analysis of SiGeC Heterojunction PMOSFETs,* IEEE Trans. El. Dev. 47, 1715 (2000); Mocuta et al., $\text{Si}_{1-x-y}\text{Ge}_x\text{C}_y$-*Channel P-MOSFET's with Improved Thermal Stability,* IEEE Elec. Dev. Lett., 21, 292 (2000). A dual channel architecture may be desirable: wherein a buried, compressive SiGe channel is used for pMOS and a surface, tensile SiC channel is used for nMOS, because tensile SiC has large conduction band offset, e.g., ~65 meV per atomic % carbon, but has a small valence band offset, while compressive SiGe has large valence band offset and a small conduction band offset, Rim et al., *Metal-oxide-semiconductors capacitance-voltage characteristics and band offsets for $\text{Si}_{1-y}\text{C}_y/\text{Si}$ heterostructures,* Appl. Phys. Lett., 72, 2286 (1998).

Adding carbon to silicon or SiGe provides advantages for heterojunction bipolar transistor (HBT) structures, U.S. Pat. No. 5,986,287, particularly in the case of compressive $\text{Si}_{1-x-y}\text{Ge}_x\text{C}_y$ base layers. The purpose of the carbon in this case is to reduce the outdiffusion of boron dopants in the base, allowing thinner base layers and faster HBT devices Sturm, *Advanced Column-IV Epitaxial Materials for Silicon-Based Optoelectronics,* MRS Bulletin, April 1998, pp. 60-64. Carbon may also be used to limit boron diffusion in source/drains and source/drain extensions Carroll et al., *Complete suppression of boron transient-enhanced diffusion and oxidation-enhanced diffusion in silicon using localized substitutional carbon incorporation,* Appl. Phys. Lett., 73, 3695 (1998). Finally, Si/SiGe/SiGeC multilayers may also be used in various combinations to produce quantum wells for optical devices Sturm, supra; Houghton et al., *Band Alignment in $Si_{1-y}C_y/Si$ (001) and $Si_{1-x}Ge_x/Si_{1-y}/Si$ (001) Quantum Wells by Photoluminescence under Applied [100] and [110] Uniaxial Stress*, Phys. Rev. Lett., 78, 2441 (1997).

These carbon-doped films have been fabricated using typical silicon precursors, e.g., $SiH_4$, $SiH_2Cl_2$, $Si_2H_6$, germanium precursors, e.g., $GeH_4$, and carbon gas precursors, such as $C_3H_8$, $C_2H_4$, $CH_4$, tetrasilylmethane $C(SiH_3)_4$, which has no C—C or C—H bonds, $C(SiH_2Cl)_4$, methylsilane $CH_3SiH_3$, dimethylsilane $(CH_3)_2SiH_2$, trimethylsilane $(CH_3)_3SiH$, tetramethylsilane $Si(CH_3)_4$, and tetra-ethylsilane $Si(CH_3CH_2)_4$, Mitchell et al., supra; Mi et al., *High quality $Si_{1-x-y}Ge_xC_y$ epitaxial layers grown on (100) Si by rapid thermal chemical vapor deposition using methylsilane*, Appl. Phys. Lett., 67, 259 (1995); Foo et al., $Si_{1-y}C_y/Si$ *(001) gas-source molecular beam epitaxy from $Si_2H_6$ and $CH_3SiH_3$: Surface reaction paths and growth kinetics*, J. Appl. Phys. 93, 3944 (2003); and Chandrasekhar et al., *Strategies for the synthesis of highly concentrated $Si_{1-y}C_y$ diamond-structured systems*, Appl. Phys. Lett. 72, 2117 (1998), and references therein. Precursors with no C—C bonds and fewer C—H bonds are preferred, because these bonds require high decomposition temperatures. In practice, methylsilane has been the most popular choice.

In spite of the problems seen thus far with the thermal stability of these layers, in light of the low bulk solubility of carbon in silicon it is remarkable that they are as stable as they are. The key seems to be a stabilization mechanism as a result of the surface structure formed during film growth. For example, theoretical calculations indicate there are sub-surface sites of the silicon (001) 2×1 reconstructed surface under compressive stress, which would favor carbon substitution, with nearby sites under tension; Liu et al., *Ab initio investigation of C incorporation mechanisms on Si(001)*, Appl. Phys. Lett. 76, 885 (2000); Remediakis et al., *Thermodynamics of C Incorporation on Si(100) from ab initio Calculations*, Phys Rev. Lett. 86, 4556 (2001). At low growth temperatures and high growth rates, the carbon may be "frozen in" at these sites, increasing the proportion of substitutional carbon Mitchell et al., supra. It may be expected that the nearby tensile sites favor germanium incorporation, which in turn should further stabilize the carbon. In addition, it is well known that adding even a small amount of germanium greatly enhances the film growth rate, which in turn should enhance the "freezing in" effect.

A similar surface growth stabilization mechanism has been found for a silicon (111) surface, involving germanium and boron, an atom similar in size to carbon; Tweet et al., *Direct Observations of Ge and Si Ordering at the $Si/B/Ge_xSi_{1-x}$(111) Interace by Anomalous X-Ray Diffraction*, Phys. Rev. Lett. 69, 2236 (1992); Tweet et al., *Increased thermal stability due to addition of Ge in B/Si(111) heterstructures*, Physica B 221, 218 (1996). The position of boron and germanium were determined by compressive and tensile sites, respectively, as controlled by the surface reconstruction. Low temperature growth was required to "freeze in" the structure. It was found that germanium enhanced the thermal stability of the boron by at least 100° C. In the case of the silicon (100) surface, it has been shown that adding 0.2% of carbon to a SiGe alloy with 10% germanium increases the thermal stability by 250° C.; Mocuta et al., *Carbon incorporation in SiGeC alloys grown by ultrahigh vacuum chemical vapor deposition*, J. Vac. Sci. Technol. A 17, 1239 (1999).

SUMMARY OF THE INVENTION

A method of providing a layer in a semiconductor device, wherein the layer includes $Si_{1-x-y}Ge_xC_y$, and wherein the carbon in the layer is in a stable condition, includes preparing a silicon substrate; preparing a SiGeC precursor; forming a $Si_{1-x-y}Ge_xC_y$ layer on the silicon substrate from the precursor, wherein x is between about 0.00 and 1.0, and wherein y is between 0.001 and 0.05; forming a top silicon layer on the $Si_{1-x-y}Ge_xC_y$ layer; and completing the semiconductor device.

It is an object of the invention to improve the thermal stability of carbon-doped silicon-based films with both tensile and compressive stress for use in various semiconductor applications.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The precursors used thus far to grow carbon-doped silicon, or carbon-doped SiGe, films all contain silicon and/or carbon, however, no precursors containing silicon, carbon and germanium are known. The germanium precursor has been provided as a separate gas, usually $GeH_4$. With such precursors, there is a limited probability that a carbon atom will find a germanium atom nearby. To maximize the stability of a carbon atom in its substitutional site, a supply of germanium atoms should be provided nearby in the optimum ratio, e.g., 1, 2, 3, or 4, possibly depending on the growth conditions, and even in the desired configuration, e.g., each carbon surrounded by four germanium atoms. The best way to ensure this is to incorporate germanium and carbon into the same precursor in the desired ratio and configuration. Such a co-delivery of germanium and carbon may be accomplished by CVD, and related methods, like PECVD.

Because it takes somewhere between 8 and 12 germanium atoms to compensate for the strain of one carbon atom Sturm, supra; De Salvador et al., *Lattice parameter of $Si_{1-x-y}Ge_xC_y$ alloys*, Rev. B, 61, 13005 (2000), a precursor having only a few germanium atoms per carbon atom would produce a film under tensile stress. If an application is found where compressive stress is desired, more germanium may be added through the use of an additional germanium precursor, such as $GeH_4$.

In the method of the invention, germanium is substituted for some of the silicon in carbon precursors as used in CVD processes. These precursors include, but are not limited to, the following: $C(SiH_2Cl)_4$, $CH_3SiH_3$, $(CH_3)_2SiH_2$, $(CH_3)_3SiH$, $Si(CH_3)_4$, $Si(CH_3CH_2)_4$, and $C(SiH_3)_4$. The germanium to carbon ratio may be adjusted as desired. For example, substituting germanium for silicon in $CH_3SiH_3$ gives $CH_3GeH_3$, having a Ge:C ratio of 1:1. Substituting germanium for silicon in $Si(CH_3)_4$ gives $Ge(CH_3)_4$ having a Ge:C ratio of 1:4. Substituting germanium for one or more of the silicon in $C(SiH_3)_4$ results in molecules having Ge:C ratios of 1:1, 2:1, 3:1, or 4:1.

The various precursors have different numbers of C—H and C—Ge (or Si) bonds as well. For example, $CH_3GeH_3$ has three C—H bonds and one C—Ge bond, while $C(GeH_3)_4$ has no C—H bonds and four C—Ge bonds. Different precursors may be preferable for different growth conditions and different applications.

Figure 1:
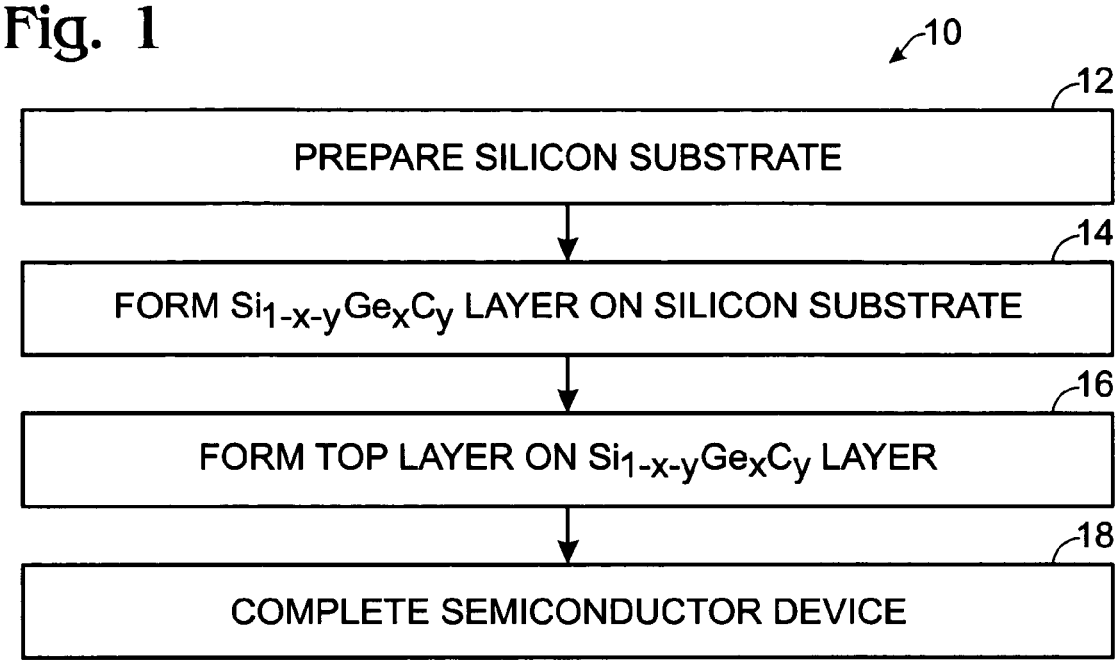
FIG. 1 is a block diagram depicting the steps of the method of the invention.
Figure 2:
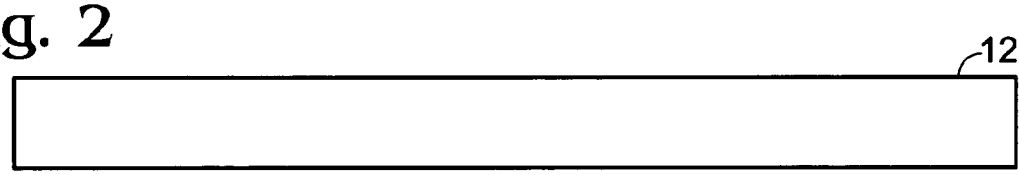
FIGS. 2 to 4 depict successive step in the formation of a SiGeC layer according to the method of the invention.
Figure 3:
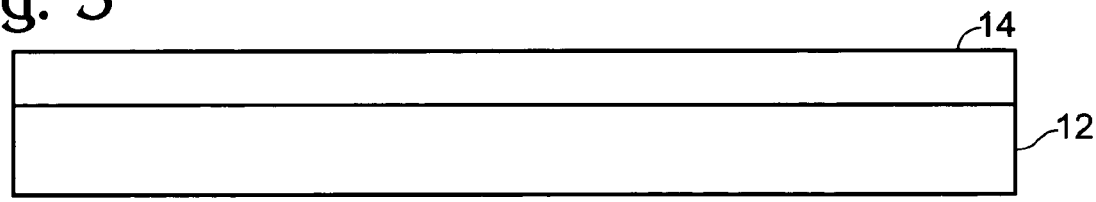
Figure 4:
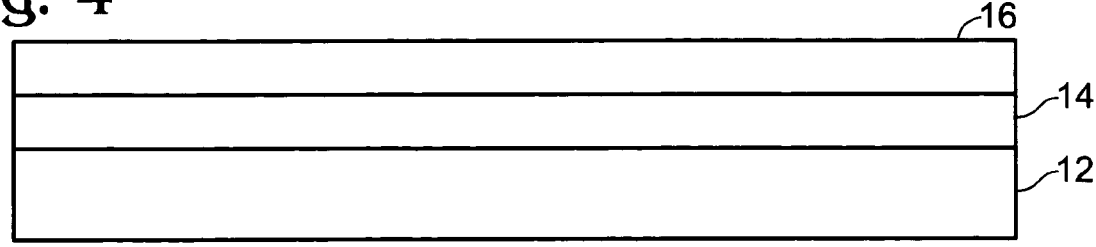

FIG. 1 depicts the steps in the method of the invention, generally at 10, while FIGS. 2 to 4 provide a schematic representation of the process steps of the method of the invention. Referring initially to FIGS. 1 and 2, a silicon substrate is prepared, 12. Substrate 12 may have (100), (110), (111), or other orientation, and may be doped or un-doped.

Next, and now referring to FIGS. 1 and 3, an epitaxial $Si_{1-x-y}Ge_xC_y$ layer 14 is grown pseudomorphically on silicon substrate 12. Depending on x and y, $Si_{1-x-y}Ge_xC_y$ layer 14 may be unstrained or under compressive or tensile strain. In the preferred embodiment of the method of the invention, x is between about 0.00 and 1.0, and y is between 0.001 and 0.05. The deposition may be carried out using any of the epitaxial growth methods which use gas precursors. These include batch furnaces, like ultra-high vacuum CVD (UHV-CVD) or low-pressure CVD (LP-CVD), or single wafer methods, like rapid thermal CVD (RTCVD) or plasma-enhanced CVD (PECVD). Depending on the precursors, the deposition may be blanket or selective. Carbon, germanium, and possibly silicon, are provided by one or more of the above-identified precursors, or their equivalents. If additional germanium is needed, a standard germanium precursor may be used, such as $GeH_4$. Additional silicon may be provided by use of standard silicon precursors, e.g., $SiH_4$, dichlorosilane, $Si_2H_6$, and may be selectivity enhanced, if desired, by the use of e.g., HCl. Growth temperatures are typically in the range of between about 400° C. to 650° C.

Alternatively, $Si_{1-x-y}Ge_xC_y$ may be deposited in an amorphous state, at low temperatures, e.g., 300° to 500° C., and then changed into an epitaxial, pseudomorphic layer by solid phase epitaxy, at temperatures typically between about 500° C. to 650° C. Carbon concentrations of up to a few percent and germanium content from 0 to 100% is possible. The thickness of the layer depends on the desired application, thermal budget, and strain. To minimize defects, it is necessary to keep the thickness below the critical thickness for generation of dislocations. For example, for a film under a 1% tensile strain for use as a high electron mobility n-channel for NMOS, a thickness of between about 5 nm to 20 nm should be used.

Finally, as shown in FIGS. 1 and 4, a top layer 16 is fabricated on top of the structure. In the example shown, it is a silicon layer. For CMOS applications, it may be desirable to provide a thin, e.g., <5 nm, sacrificial silicon layer to protect $Si_{1-x-y}Ge_xC_y$ layer 14 during wafer cleaning and prior to fabrication of a high quality gate oxide. After the layers described herein have been formed, the semiconductor device may be completed, 18.

These precursors may be used to fabricate any of the structures in which SiGe or SiGeC may be used, which includes, but is not limited to: surface channel tensile nMOS and pMOS, buried channel compressive pMOS, dual channel buried compressive pMOS with surface tensile NMOS, source/drain regions for CMOS, base layers for HBTs, and various multilayers/quantum wells for optoelectronic applications.

Thus, a method to stabilize carbon in $Si_{1-x-y}Ge_xC_y$ layers has been disclosed. It will be appreciated that further variations and modifications thereof may be made within the scope of the invention as defined in the appended claims.

I claim:

1. A method of providing a layer in a semiconductor device, wherein the layer includes $Si_{1-x-y}Ge_xC_y$, and wherein the carbon in the layer is in a stable condition, comprising:
   preparing a silicon substrate;
   forming a $Si_{1-x-y}Ge_xC_y$ layer on the silicon substrate, wherein x is between about 0.00 and 1.0, and wherein y is between 0.001 and 0.05, wherein said forming a $Si_{1-x-y}Ge_xC_y$ layer includes preparing a SiGeC precursor taken from the group of precursors consisting of $C(SiH_2Cl)_4$, $CH_3SiH_3$, $(CH_3)_2SiH_2$, $(CH_3)_3SiH$, $Si(CH_3)_4$, $Si(CH_3CH_2)_4$, and $C(SiH_3)_4$, and substituting at least one Ge atom for a Si atom, and wherein the $Si_{1-x-y}Ge_xC_y$ layer is mechanically stressed in a manner taken from the groups of mechanical stresses consisting of strained and unstrained;
   forming a top layer on the $Si_{1-x-y}Ge_xC_y$ layer; and
   completing the semiconductor device.

2. The method of claim 1 wherein said preparing a SiGeC precursor includes preparing a precursor having a Ge:C ratio of between about 4:1 to 1:4.

3. The method of claim 2 wherein said preparing a SiGeC precursor includes preparing a precursor having between about zero to three C—H bonds and between about one to four C—Ge bonds.

4. A method of providing a layer in a semiconductor device, wherein the layer includes $Si_{1-x-y}Ge_xC_y$, and wherein the carbon in the layer is in a stable condition, comprising:
   preparing a silicon substrate;
   preparing a SiGeC precursor taken from the group of precursors consisting of $C(SiH_2Cl)_4$, $CH_3SiH_3$, $(CH_3)_2SiH_2$, $(CH_3)_3SiH$, $Si(CH_3)_4$, $Si(CH_3CH_2)_4$, and $C(SiH_3)_4$, and substituting at least one Ge atom for a Si atom
   forming a $Si_{1-x-y}Ge_xC_y$ layer on the silicon substrate using the SiGeC precursor, wherein x is between about 0.0 and 1.0, and wherein y is between 0.001 and 0.05;
   forming a top silicon layer on the $Si_{1-x-y}Ge_xC_y$ layer; and
   completing the semiconductor device.

5. The method of claim 4 wherein said forming a $Si_{1-x-y}Ge_xC_y$ layer includes forming a strained $Si_{1-x-y}Ge_xC_y$ layer.

6. The method of claim 4 wherein said forming a $Si_{1-x-y}Ge_xC_y$ layer includes forming an unstrained $Si_{1-x-y}Ge_xC_y$ layer.

7. The method of claim 4 wherein said preparing a SiGeC precursor includes preparing a precursor having a Ge:C ratio of between about 4:1 to 1:4.

8. The method of claim 4 wherein said preparing a SiGeC precursor includes preparing a precursor having between about zero to three C—H bonds and between about one to four C—Ge bonds.

9. A method of providing a layer in a semiconductor device, wherein the layer includes $Si_{1-x-y}Ge_xC_y$, and wherein the carbon in the layer is in a stable condition, comprising:
   preparing a silicon substrate;
   preparing a SiGeC precursor taken from the group of precursors consisting of $C(SiH_2Cl)_4$, $CH_3SiH_3$, $(CH_3)_2SiH_2$, $(CH_3)_3SiH$, $Si(CH_3)_4$, $Si(CH_3CH_2)_4$, and $C(SiH_3)_4$, and substituting at least one Ge atom for a Si atom
   depositing a $Si_{1-x-y}Ge_xC_y$ layer on the silicon substrate using the SiGeC precursor;
   forming a top silicon layer on the $Si_{1-x-y}Ge_xC_y$ layer; and
   completing the semiconductor device.

10. The method of claim 9 wherein said depositing a $Si_{1-x-y}Ge_xC_y$ layer on the silicon substrate includes depositing a $Si_{1-x-y}Ge_xC_y$ layer wherein x is between about 0.0 and 1.0, and wherein y is between 0.001 and 0.05.

11. The method of claim 9 wherein said preparing a SiGeC precursor includes preparing a precursor having a GeC ration of between about 4:1 to 1:4.

12. The method of claim 9 wherein said preparing a SiGeC precursor includes preparing a precursor having between about zero to three C—H bonds and between about one to four C—Ge bonds.

13. The method of claim 9 wherein said forming a $Si_{1-x-y}Ge_xC_y$ layer includes forming a strained $Si_{1-x-y}Ge_xC_y$ layer.

14. The method of claim 9 wherein said forming a $Si_{1-x-y}Ge_xC_y$ layer includes forming an unstrained $Si_{1-x-y}Ge_xC_y$ layer.

* * * * *